United States Patent
Feurle et al.

(10) Patent No.: US 6,281,586 B1
(45) Date of Patent: Aug. 28, 2001

(54) INTEGRATED SEMICONDUCTOR CIRCUIT CONFIGURATION HAVING STABILIZED CONDUCTOR TRACKS

(75) Inventors: Robert Feurle, Neubiberg; Helmut Schneider, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/510,637

(22) Filed: Feb. 22, 2000

(30) Foreign Application Priority Data

Feb. 19, 1999 (DE) ............................................. 199 07 127

(51) Int. Cl.[7] ........................... H01L 23/12; H01L 23/48; H01L 23/52
(52) U.S. Cl. ........................... 257/758; 257/773; 257/776
(58) Field of Search ..................... 257/758, 762, 257/765, 773, 776, 780

(56) References Cited

U.S. PATENT DOCUMENTS

| 4,729,063 | | 3/1988 | Matsuo et al. | 361/414 |
| 5,625,232 | * | 4/1997 | Numata et al. | 257/758 |
| 5,847,466 | * | 12/1998 | Ito et al. | 257/775 |

FOREIGN PATENT DOCUMENTS

0692824A2    1/1996  (EP) .

* cited by examiner

*Primary Examiner*—Nathan Flynn
*Assistant Examiner*—Thomas L. Dickey
(74) *Attorney, Agent, or Firm*—Herbert L. Lerner; Laurence A. Greenberg; Werner H. Stemer

(57) ABSTRACT

An integrated semiconductor circuit configuration includes stabilized conductor tracks which run in different planes. Critical locations of the conductor tracks which are dictated by the layout are provided with dummy contacts.

8 Claims, 2 Drawing Sheets

INTEGRATED SEMICONDUCTOR CIRCUIT CONFIGURATION HAVING STABILIZED CONDUCTOR TRACKS

BACKGROUND OF THE INVENTION

Field of the Invention

The present invention relates to an integrated semiconductor circuit configuration having conductor tracks or interconnects that run in at least two different planes, in which conductor tracks in at least one of the planes are provided in close proximity and essentially parallel to one another.

During the fabrication of integrated semiconductor circuit configurations, such as semiconductor memories for example, if, by way of example, conductor tracks run closely adjacent and parallel to one another and one of those conductor tracks is interrupted, it is possible for so-called proximity effects to occur. Those effects ultimately result in a conductor track exhibiting a critical location in such a region, at which the conductor track can become unstable and even tend toward an interruption. That instability is explained below with reference to FIG. 4. FIG. 3 shows how a discontinuity affects a conductor track.

If such discontinuities are present on both sides of a conductor track, then such a conductor track may become constable, and it may even break.

Such critical locations of conductor tracks need not necessarily be due only to so-called proximity effects. Conductor tracks can also be guided in certain ways, having to do especially with curvatures having a small radius of curvature, that can lead to such critical locations.

It goes without saying that such critical locations are highly undesirable, which is why the geometrical dimensions of the conductor tracks are often enlarged at those locations. However, such a procedure has the disadvantage of causing the conductor tracks and the spacings between them to thus inevitably be enlarged, which is at odds with the constant striving to miniaturize integrated semiconductor circuit configurations.

SUMMARY OF THE INVENTION

It is accordingly an object of the invention to provide an integrated semiconductor circuit configuration having stabilized conductor tracks, which overcomes the hereinaforementioned disadvantages of the heretofore-known devices of this general type and in which instabilities of conductor tracks at critical locations can be reliably avoided.

With the foregoing and other objects in view there is provided, in accordance with the invention, an integrated semiconductor circuit configuration, comprising conductor tracks having a given layout and running in at least two different planes, the conductor tracks in at least one of the planes disposed in close proximity and substantially parallel to one another, and the conductor tracks having a dummy contact disposed underneath the conductor tracks at critical locations dictated by the given layout.

The integrated semiconductor circuit configuration according to the invention thus provides a surprisingly simple solution to the above problem of critical locations especially due to the proximity effect. At such locations, the conductor tracks have a dummy contact situated underneath them in a simple manner. The dummy contact can lead as far as an underlying metalization plane without establishing an electrical connection there. As a result, the conductor track has a sufficient cross section in the region of the critical location, so that any instability of the conductor track and any interruption thereof are reliably prevented.

In accordance with another feature of the invention, the dummy contacts are provided at critical locations which are dictated by an interruption of one of two closely adjacent, parallel conductor tracks.

In accordance with a concomitant feature of the invention, the conductor tracks have a width of approximately 150 to 250 nm and a spacing from one another on the order of magnitude of approximately 130 to 180 nm.

Therefore, in the case of the integrated semiconductor circuit configuration according to the invention, dummy contacts are provided at critical locations of conductor tracks. These dummy contacts increase the cross sections of the conductor track at these critical locations, with the result that it is no longer possible for instabilities of the conductor track to occur or even for the latter to break. Increased electromigration susceptibilities are reliably avoided.

The use of the dummy contacts thus makes it possible to provide layouts having critical geometries, that is to say particularly small structures, with the result that the invention promotes further miniaturization of integrated semiconductor circuit configurations.

The present invention affords advantages in a particularly advantageous manner in so-called damascene and dual damascene metalization systems of integrated circuits, since in these systems, the dummy contacts result not only in a local widening of the geometry of the conductor track but also in a local increase in the line cross section.

If appropriate, the invention can also be used in an advantageous manner in other lithographically defined metalization systems, and not just for integrated circuits.

Other features which are considered as characteristic for the invention are set forth in the appended claims.

Although the invention is illustrated and described herein as being embodied in an integrated semiconductor circuit configuration having stabilized conductor tracks, it is nevertheless not intended to be limited to the illustrated details, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 4:
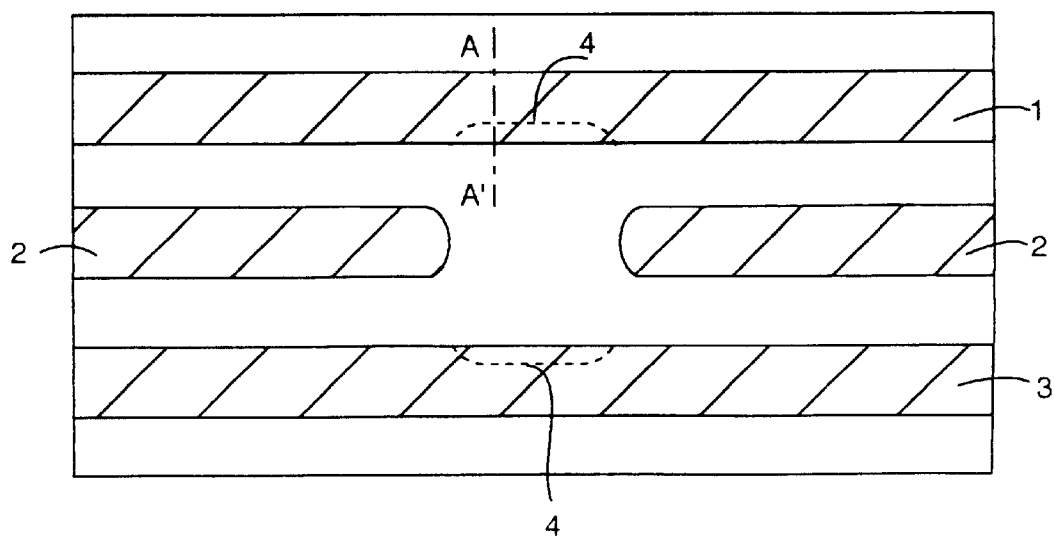
FIG. 4 is a plan view of conductor tracks, which is used to explain the problem underlying the invention.

Referring now in detail to the figures of the drawings, in which mutually corresponding components are provided with the same reference symbols, and first, particularly, to FIG. 4 thereof, there is seen a plan view of three conductor tracks or interconnects 1 to 3, wherein the conductor track 2 is interrupted in its center. This interruption may be caused, for example, by the fact that opposite central ends of this conductor track 2 in FIG. 4 are connected through contacts to a component located in a different metallization plane. At any rate, this interruption of the conductor track 2 means that there is a discontinuity in the proximity of the conductor tracks 1 and 3. Such discontinuities occur, in particular, whenever two mutually adjacent conductor tracks cross one another in a twist region, for example in a semiconductor memory. Further conductor tracks adjoining this twist region then "see" the discontinuity of the twist region.

At any rate, it has been shown that adjacent conductor tracks are adversely affected by such discontinuities. This is because if a discontinuity is present, then during fabrication, the adjacent conductor tracks, that is to say the conductor tracks 1 and 3 in the present example, may have a reduced cross section in the region of the discontinuity, as is indicated by dashed lines 4 for the respective conductor tracks 1 and 3.

Figure 3:
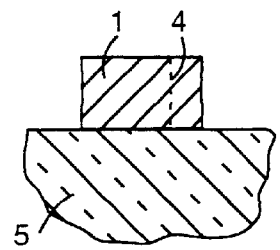
FIG. 3 is a fragmentary, sectional view taken along a line A–A' in FIG. 4 through an existing conductor track.

FIG. 3 is a cross-sectional view taken along a line A'A' in FIG. 4, showing how this discontinuity affects the conductor track 1. The conductor track 1, which runs, for example, on an insulating layer 5 made of silicon dioxide, has a reduced cross section in the region of the discontinuity of the conductor track 2. That cross section is delimited by the dashed line 4.

Figure 1:
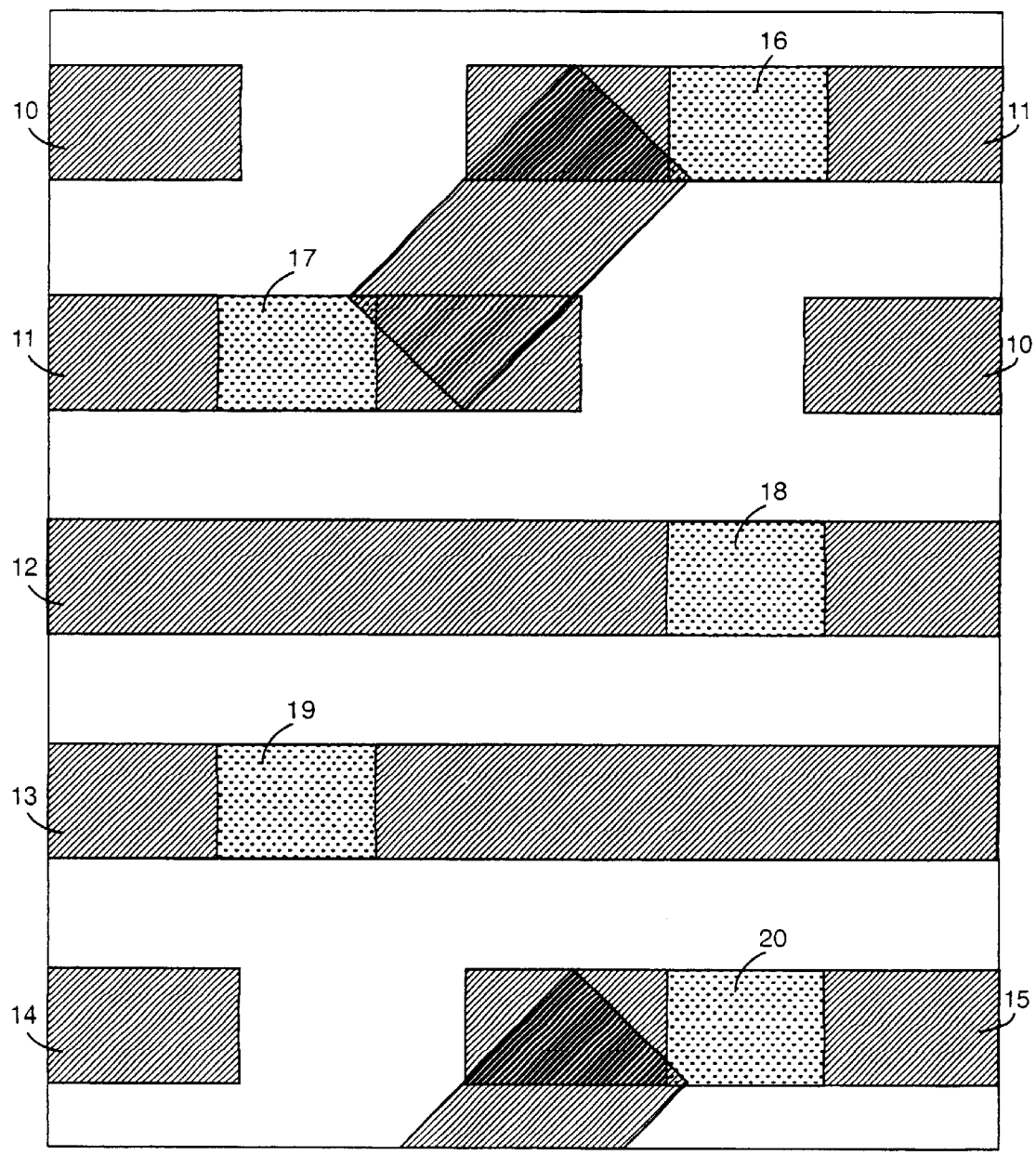
FIG. 1 is a diagrammatic plan view of various conductor tracks with dummy contacts according to the present invention.

FIG. 1 is a plan view of a metalization plane which shows conductor tracks or interconnections 10 to 15. On one hand, the conductor tracks 10, 11 as well as 14, 15 each cross one another in a twist region. In other words, the conductor track 10 is guided over the conductor track 11, in a further plane located above the metalization plane of FIG. 1, at a distance, and is isolated by an insulating layer. The conductor tracks 12 and 13, on the other hand, are continuous conductor tracks.

The conductor tracks 14 and 15 have a similar structure to the conductor tracks 10 and 11.

These conductor tracks 10 to 15 may, for example, be bit lines of a memory cell array. The width of the conductor tracks lies between 150 and 250 nm and is preferably approximately 200 nm. The spacing between the conductor tracks lies between 130 and 180 nm. The conductor tracks themselves may be composed of aluminum or copper or other suitable materials.

It has been shown that during the metalization of the conductor tracks 10 to 15, critical locations are produced, due to the proximity effect, wherever discontinuities are present in the vicinity of the conductor tracks. Such discontinuities occur when an adjacent conductor track is interrupted. The conductor tracks have instabilities, which can even lead to the conductor tracks breaking, at these discontinuous locations.

According to the invention, dummy contacts 16 to 20 are provided at these critical locations. The dummy contacts lead to a plane located below the conductor track plane of FIG. 1.

Figure 2:
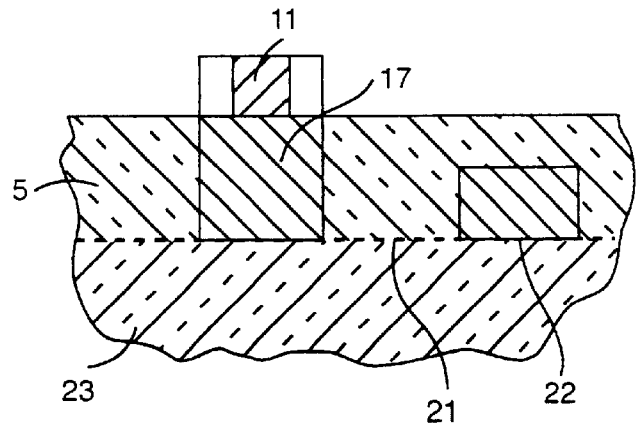
FIG. 2 is a fragmentary, sectional view through a conductor track with a dummy contact according to the invention.

FIG. 2 shows a section through such a dummy contact, for example the dummy contact 17. The conductor track 11 has a reduced cross section in this case due to the discontinuous proximity. As is shown in FIG. 2, the reduced cross section can also occur on both sides, if appropriate. The dummy contact 17 is therefore provided underneath the conductor track 11 in order to strengthen the latter. The dummy contact 17 penetrates through an insulating layer 5 made of silicon dioxide and leads as far as a deeper conductor track plane 21. Additional conductor tracks 22, which lie on a silicon dioxide layer 23 and are electrically insulated from the dummy contact 17, may run on this conductor track plane 21.

What is essential to the present invention, then, is that conductor tracks are deliberately provided with dummy contacts at critical locations, with the result that any instability of the conductor track and/or breaking thereof can be reliably avoided. These dummy contacts need not, of course, extend as far as the next conductor track plane. Rather, it suffices for the dummy contacts to have a cross section such that any instability and/or breaking of the conductor track which they strengthen can be reliably precluded.

We claim:

1. An integrated semiconductor circuit configuration, comprising:

conductor tracks running in at least two different planes, said conductor tracks in at least one of said planes disposed in close proximity and substantially parallel to one another, and said conductor tracks having a dummy contact disposed underneath said conductor tracks at locations affected by a discontinuity.

2. The integrated semiconductor circuit configuration according to claim 1, wherein said discontinuity is generated by an interruption of one of two closely adjacent, parallel conductor tracks.

3. The integrated semiconductor circuit configuration according to claim 1, wherein said conductor tracks have a width of 150 to 250 nm.

4. The integrated semiconductor circuit configuration according to claim 1, wherein said conductor tracks have a width of 200 nm.

5. The integrated semiconductor circuit configuration according to claim 1, wherein said conductor tracks are separated by a spacing of between 130 and 180 nm.

6. The integrated semiconductor circuit configuration according to claim 1, wherein said conductor tracks are formed of a material selected from the group consisting of aluminum and copper.

7. The integrated semiconductor circuit configuration according to claim 1, wherein said discontinuity is in a twist region and caused by a twist.

8. The integrated semiconductor circuit configuration according to claim 1, wherein said discontinuity is caused by another conductor track.

* * * * *